(12) United States Patent
Rhodes

(10) Patent No.: US 7,388,289 B1
(45) Date of Patent: Jun. 17, 2008

(54) LOCAL MULTILAYERED METALLIZATION

(75) Inventor: Howard E. Rhodes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/388,567

(22) Filed: Sep. 2, 1999

(51) Int. Cl.
H01L 23/48 (2006.01)
H01L 23/52 (2006.01)
H01L 29/40 (2006.01)

(52) U.S. Cl. .................. 257/751; 257/758; 257/E29.11; 257/E29.131

(58) Field of Classification Search ........ 438/689–692, 438/700, 638; 257/758, 751, 774, 762, E29.11, 257/E29.131, E29.165, E29.116, E29.127, 257/E29.129
See application file for complete search history.

(56) References Cited

U.S. PATENT DOCUMENTS

| 5,231,053 | A |   | 7/1993  | Bost et al.       |         |
|-----------|---|---|---------|-------------------|---------|
| 5,231,607 | A |   | 7/1993  | Yoshida et al.    |         |
| 5,357,136 | A | * | 10/1994 | Yoshioka          | 257/383 |
| 5,365,112 | A | * | 11/1994 | Ohshima           | 257/784 |
| 5,368,880 | A |   | 11/1994 | McKee et al.      | 427/125 |
| 5,444,018 | A | * | 8/1995  | Yost et al.       | 438/644 |
| 5,659,201 | A |   | 8/1997  | Wollesen          |         |
| 5,738,917 | A |   | 4/1998  | Besser et al.     | 427/576 |
| 5,785,236 | A |   | 7/1998  | Cheung et al.     |         |
| 5,918,149 | A |   | 6/1999  | Besser et al.     |         |
| 5,933,364 | A |   | 8/1999  | Aoyama et al.     |         |
| 5,936,283 | A | * | 8/1999  | Narita et al.     | 257/355 |
| 5,943,254 | A |   | 8/1999  | Bakeman, Jr. et al. |       |
| 5,943,285 | A |   | 8/1999  | Kohno             |         |
| 5,956,612 | A |   | 9/1999  | Elliott et al.    |         |
| 5,978,623 | A |   | 11/1999 | Itoh              |         |
| 5,981,386 | A | * | 11/1999 | Ho et al.         | 438/672 |
| 6,069,066 | A | * | 5/2000  | Huang et al.      | 438/612 |
| 6,080,656 | A | * | 6/2000  | Shih et al.       | 257/762 |
| 6,093,966 | A | * | 7/2000  | Venkatraman et al. | 257/740 |
| 6,147,404 | A | * | 11/2000 | Pramanick et al.  | 257/751 |
| 6,150,687 | A | * | 11/2000 | Noble et al.      | 257/302 |
| 6,174,804 | B1| * | 1/2001  | Hsu               | 438/638 |
| 6,191,023 | B1| * | 2/2001  | Chen              | 438/612 |
| 6,208,547 | B1| * | 3/2001  | Ooishi            | 365/51  |
| 6,218,302 | B1|   | 4/2001  | Braeckelmann et al. |       |
| 6,245,380 | B1| * | 6/2001  | Sun et al.        | 427/97  |
| 6,255,151 | B1| * | 7/2001  | Fukuda et al.     | 438/197 |
| 6,258,707 | B1| * | 7/2001  | Uzoh              | 438/618 |
| 6,274,923 | B1| * | 8/2001  | Mikagi            | 257/642 |
| 6,285,038 | B1|   | 9/2001  | Rhodes            |         |
| 6,303,492 | B1|   | 10/2001 | Rhodes et al.     |         |

(Continued)

Primary Examiner—Walter L Lindsay, Jr.
(74) Attorney, Agent, or Firm—Schwegman, Lundberg & Woessner, P.A.

(57) ABSTRACT

An interconnect comprises a trench and a number of metal layers above the trench. The trench has a depth and a width. The depth is greater than a critical depth, and the number of metal layers is a function of the width. In an alternate embodiment, a metallization structure having a trench including a metal layer and a second trench including a plurality of metal layers coupled to the metal layer is disclosed. The metal layer is highly conductive, and at least one of the plurality of metal layers is a metal layer that is capable of being reliably wire-bonded to a gold wire. The trench is narrower than the second trench, and at least one of the plurality of metal layers is copper or a copper alloy.

32 Claims, 7 Drawing Sheets

U.S. PATENT DOCUMENTS

| | | | |
|---|---|---|---|
| 6,348,731 B1 * | 2/2002 | Ashley et al. | 257/751 |
| 6,351,028 B1 * | 2/2002 | Akram | 257/686 |
| 6,404,053 B2 * | 6/2002 | Givens | 257/751 |
| 6,413,858 B1 * | 7/2002 | Chopra | 438/643 |
| 6,551,916 B2 * | 4/2003 | Lin et al. | 438/612 |
| 6,611,037 B1 | 8/2003 | Rhodes | |
| 6,833,623 B2 * | 12/2004 | Leiphart | 257/758 |
| 2001/0045654 A1 * | 11/2001 | Givens | 257/758 |
| 2002/0022363 A1 * | 2/2002 | Ritzdorf et al. | 438/672 |
| 2006/0199387 A1 | 9/2006 | Rhodes | |

* cited by examiner

LOCAL MULTILAYERED METALLIZATION

FIELD OF THE INVENTION

This invention relates to the field of integrated circuit manufacturing, and more particularly to metallization in integrated circuit manufacturing.

BACKGROUND OF THE INVENTION

Copper and copper alloys are often substituted for the more traditional aluminum and aluminum alloys as the primary signal and power carrying conductive structures in integrated circuits. Unfortunately, when copper and copper alloy pads are wire-bonded to a highly conductive wire, such as a gold, using current state-of-the-art wire-bonding processes, the resulting copper and gold bonds or copper alloy and gold bonds are not as reliable as aluminum and gold bonds or aluminum alloy and gold bonds used in the prior art.

One solution to this problem is shown in the prior art bonding structure 100 of FIG. 1. Bonding structure 100 includes substrate 103, copper conductor 106, dielectric layer 109, barrier layer 112, aluminum layer 115, passivation layer 116 and polyimide layer 118. To avoid wire-bonding to copper, dielectric layer 109 is etched at the location of copper conductor 106, and a barrier layer 112 of titanium or titanium nitride is deposited above copper conductor 106. Aluminum layer 115 is deposited above barrier layer 112, and passivation 116 and polyimide layers 118 are deposited above aluminum layer 115. Finally, passivation 116 and polyimide 118 layers are etched to expose aluminum layer 115 for wire-bonding. Unfortunately, this solution has several problems. First, it requires two extra masking operations that are not required when wire-bonding to an aluminum or an aluminum-copper conductor. It requires a masking operation to expose copper conductor 106 prior to depositing barrier layer 112 and aluminum layer 115, and it requires a masking operation to pattern aluminum layer 115, prior to wire-bonding. Second, the extra processing steps increase the complexity of the manufacturing operation and the failure rate of the manufactured circuits. Third, the solution is expensive, since it requires more materials, masking steps, and time than the prior art processes to manufacture the integrated circuit.

For these and other reasons there is a need for the present invention.

SUMMARY OF THE INVENTION

The above mentioned problems with integrated circuit metallization and other problems are addressed by the present invention and will be understood by reading and studying the following specification.

An interconnect comprising a trench and a number of metal layers above the trench is disclosed. The trench has a depth and a width. The depth is greater than a critical depth, and the number of metal layers is determined by the width.

In an alternate embodiment, a metallization structure having a trench including a metal layer and a second trench including a plurality of metal layers coupled to the metal layer is disclosed. The metal layer is highly conductive, and at least one of the plurality of metal layers is a metal layer that is capable of being reliably wire-bonded to a gold wire. The trench is narrower than the second trench, and at least one of the plurality of metal layers is copper or a copper alloy.

DETAILED DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the appended claims.

Figure 1:
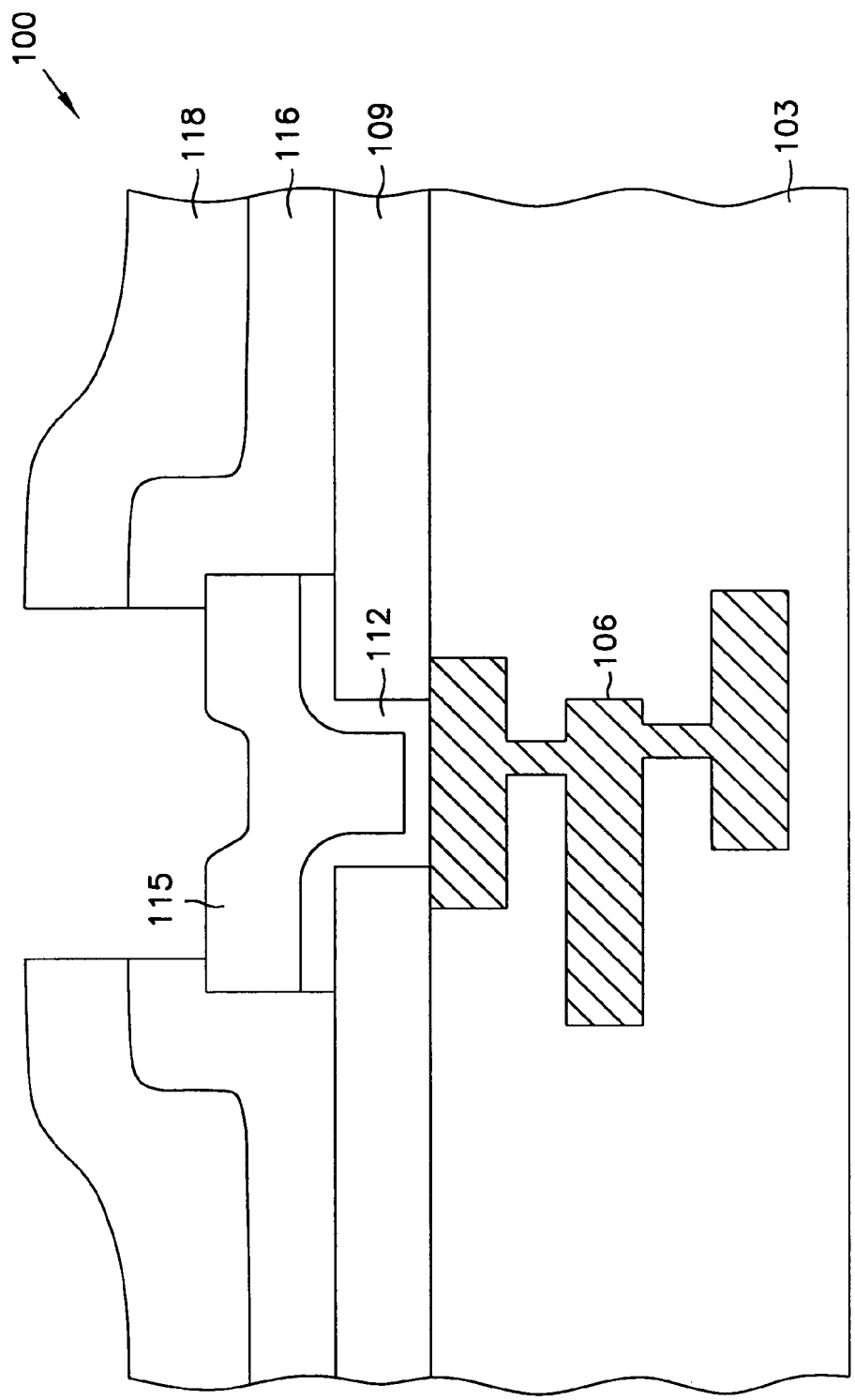
FIG. 1 is a cross-sectional side view of a prior art metallization bonding structure.
Figure 2:
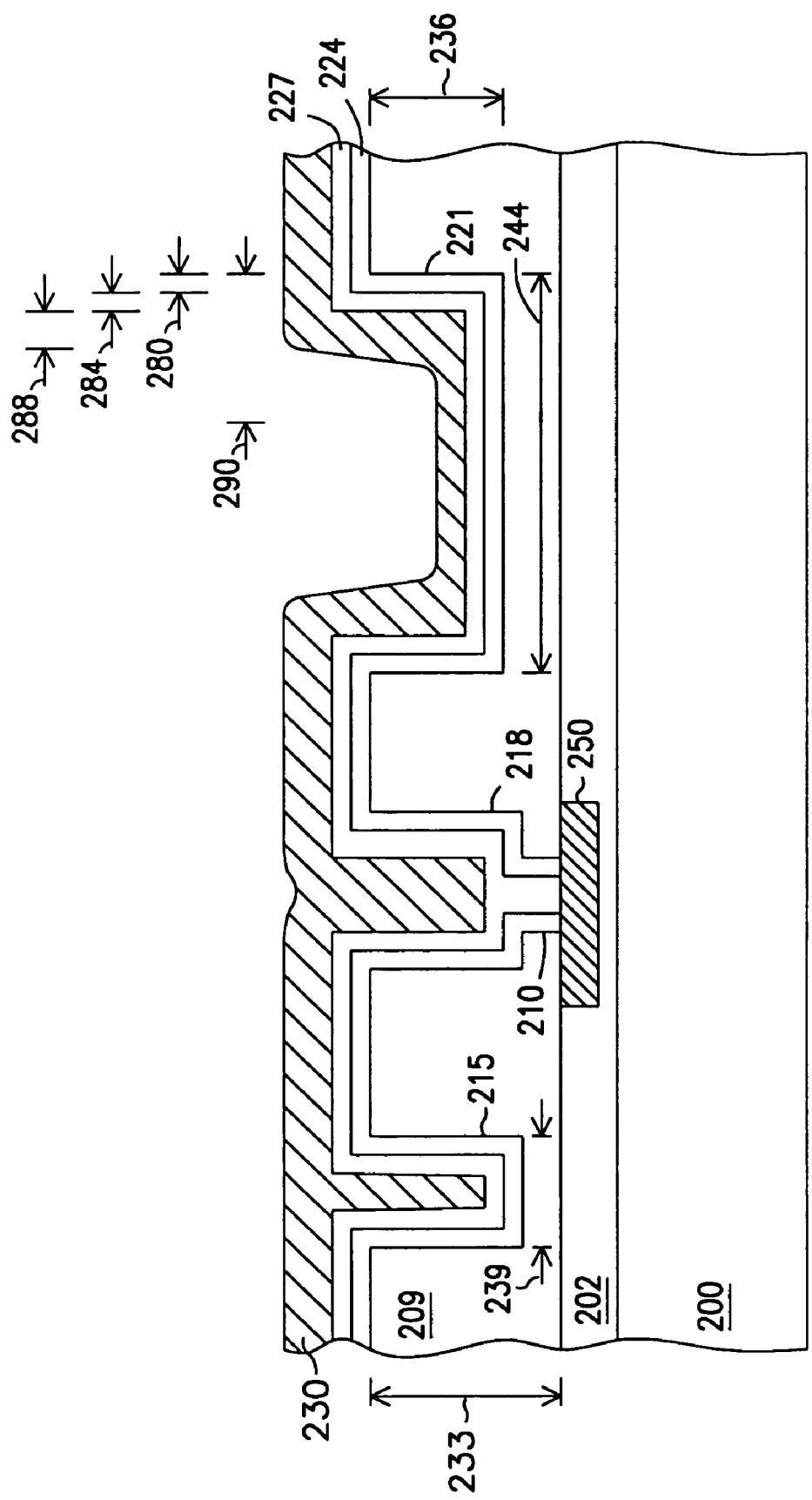
FIG. 2 is a cross-sectional side view of a substrate having trenches and barrier and copper metallization deposited on the substrate.

FIG. 2 is a cross-sectional side view of one embodiment of the invention. In the substrate 200 there will be various implants such as NWELLs, PWELLs, transistor implants, and source-drain implants that are, for simplicity, not shown. Over the substrate 200 may be formed transistor gates, polysilicon or tungsten plugs, and contact holes from the first layer of metallization down to these underlying layers and the silicon substrate. For simplicity, none of these details are shown as they are elements that are well known and may also be present. Over these structures and over the substrate 200 is shown an insulating layer 202. A conductive layer 250 is shown formed in insulating layer 202. Insulating layer 209 is deposited above conductive layer 250 and above the insulating layer 202. If the top surface defined by insulating layer 202 and conductive layer 250 is not globally planar, then the top surface of insulating layer 209 will need to be made globally planar by chemical mechanical polishing (CMP). Openings 210 (in the insulating layer 209) to the conductive layer 250 are formed by patterning and etching.

Next, trenches 215, 218, 221 are etched into the insulating layer. Barrier layer 224, seed layer 227, and copper layer 230 are then deposited into these trenches.

What is shown in FIG. 2 is a double damascene process in which both the opening 210 and the trenches 215, 218, 221 are patterning into the insulating layer 209 prior to depositing any metal layers. As is well known in the art, a single damascene process could have been shown. Trench 221 is the bonding pad trench.

Substrate 200 is a semiconductor, such as silicon or germanium, or other material, such as gallium arsenide or silicon-on-sapphire, suitable for use as a substrate in the fabrication of integrated circuits.

Insulating layer 209 is deposited above substrate 200. Insulating layer 209 blocks undesired current flow between the substrate 200 and the conductive layers above insulating layer 209. Insulating layer 209 additionally serves to block current flow between distinct conductive lines patterned into the insulating layer 209. Insulating layer 209 is not limited to a particular insulating material. In one embodiment, insulating layer 209 is an oxide, such as silicon oxide, fluorinated silicon oxide, or silicon dioxide. In an alternate embodiment, insulating layer 209 is a polymer, a foamed polymer, or polyimide. After insulating layer 209 is deposited on conductive layer 250 and insulating layer 202, the surface of insulating layer 209 may be planarized using a surface planarizing process, such as chemical mechanical polishing. This planarization of layer 209 is required if the top surface of the underlying insulating layer 202 and conductive layer 250 was not previously planarized. The insulating layer has a final thickness 233.

Trenches or depressions 215, 218, 221 are etched in insulating layer 209 and when filled with a conductive material are capable of functioning as electrical interconnects, signal carrying conductors, conductive structures, or connective structures coupling together integrated circuit elements, such as resistors, capacitors, and transistors, or coupling integrated circuit elements to bonding pads. These electrical interconnects are also suitable for use in connection with the fabrication of memory circuits or cells, logic circuits or cells, and analog circuits or cells. Trenches 215 and 218 are etched to dimensions suitable for a signal carrying conductor. All trenches 215, 218, 221 are etched to a depth 236. Signal carrying conductor filled trench 215 has a width 239 and a depth 236. Width 239 and depth 236 are selected to provide a particular resistance and capacitance for the conductor. Since the resistance of a conductor is inversely proportional to the cross-sectional area of conductor, the greater the depth 236 and width 239 of trench 215, the less the resistance of the conductor that fills the trenches.

The widths of trenches 215 and 218 are not limited to a particular value. For example, in one embodiment, trench 215 is etched to a width 239 that is less than the width 244 of bonding pad trench 221. Restricting the width of trenches 215 and 218 to a width that is less than the width of bonding pad trench 221 permits trenches 215 and 218 to overfill during a copper deposition process, while bonding pad trench 221 under fills.

Trench 221 is a bond pad. Trench 221, in one embodiment, is etched to dimensions sufficient for use in a wire-bonding operation, and trench 221 is etched to a width 244 that is greater than the width 239 of trench 215 and the width of trench 218.

Critical width 290, in one embodiment, is defined as twice the sum of the side wall barrier thickness 280, the sidewall seed thickness 284, and the sidewall copper thickness 288 (i.e., critical width 290, equals 2×[sidewall barrier thickness 280+sidewall seed thickness 284+sidewall copper thickness 288]).

The minimum trench width 239 is less than or equal to the critical width 290. The bond pad trench 244 is greater than the critical width 290.

Figure 3:
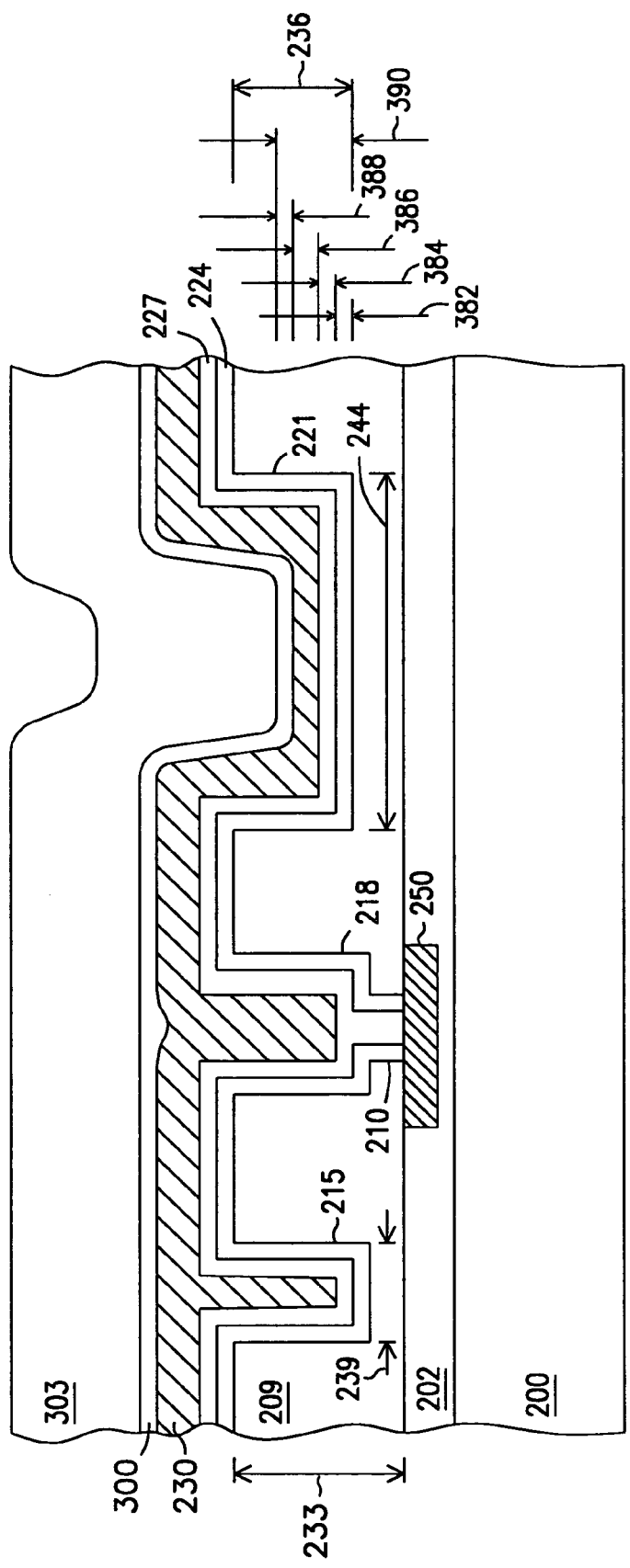
FIG. 3 is a cross-sectional side view of a substrate having a barrier layer and a conductive layer deposited above a copper layer on the substrate.
Figure 4:
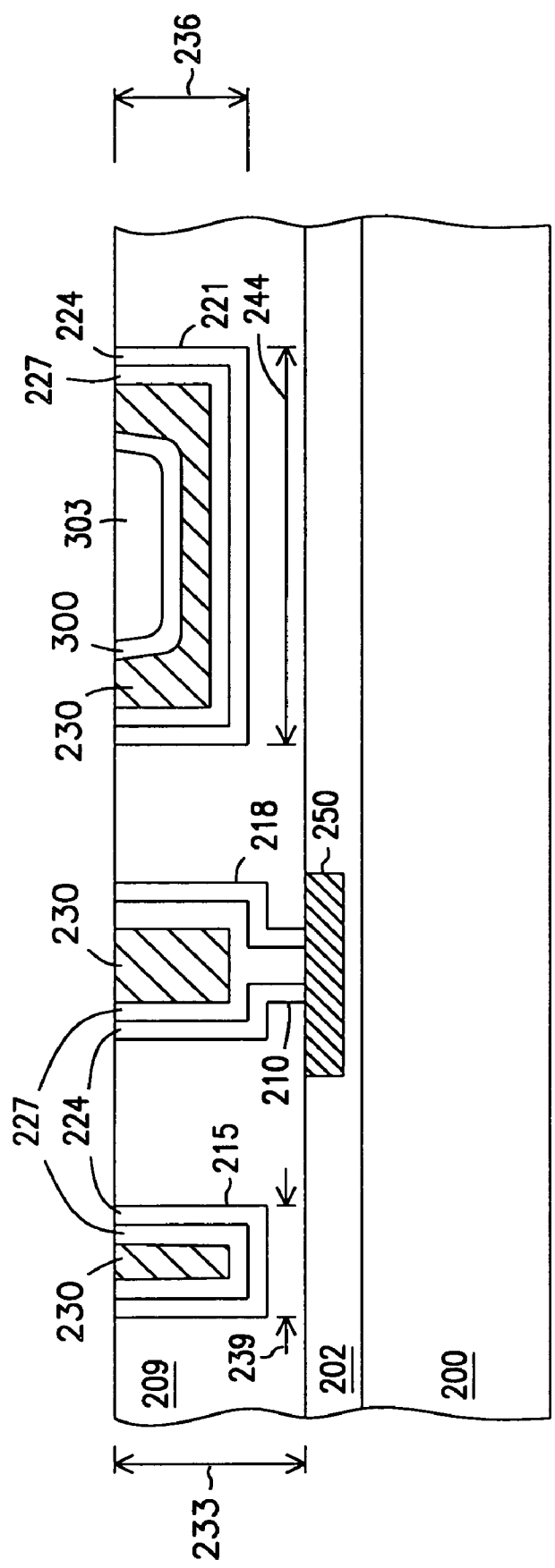
FIG. 4 is cross-sectional side view of a substrate having a filled bond pad trench and a filled signal carrying trench after chemical mechanical polishing.

The process flow shown in FIGS. 2, 3, and 4 is a dual damascene process. In this process the opening 210 and the trenches 215, 218, 221 are formed in the insulating layer 209. Then the metallization layers are deposited to simultaneously deposit into the opening 210 and the trenches 215, 218, 221. A variety of devices, such as memory cells, logic cells, capacitors, and transistors, can be interconnected using a dual damascene process with a copper interconnect.

Alternatively, a simple damascene process may be used. In the simple damascene process, openings are formed in an insulating layer down to a conducting layer. The opening is then filled with a conducting material such as Ti/TiN/W. This Ti/TiN/W deposition is removed from the surface of the insulating layer by dry etch, wet etch, or CMP to leave the Ti/TiN/W metal sandwich structure in the openings only. Next, another insulating layer is deposited and trenches are etched through this insulating layer, so that a trench exposes the top surface of the Ti/TiN/W metallization in an opening. The trenches are then deposited with a second metallization. After a subsequent metal dry etch or CMP, the damascene metallization in the trenches is formed.

Barrier layer 224 is deposited above insulating layer 209 to block the diffusion of copper into insulating layer 209. In one embodiment, barrier layer 224 is fabricated from titanium and titanium nitride. In an alternate embodiment, barrier layer 224 is fabricated from tantalum. In another alternate embodiment, barrier layer 224 is fabricated from tantalum nitride. In still another alternate embodiment, barrier layer 224 is fabricated from tantalum and tantalum nitride. Barrier layer 224 is deposited to a thickness of between about 50 and about 1000 angstroms. Forming a barrier layer 224 having a thickness of less than about 50 angstroms does not adequately block the flow of impurities into insulating layer 209. Forming barrier layer 224 with a thickness of more than about 1000 angstroms tends to leave insufficient space in trenches 215 and 218 for a conductive material. In the preferred embodiment, barrier layer 224 is formed from tantalum nitride deposited to a thickness of between about 100 and 500 angstroms. In the preferred embodiment, barrier layer 224 is deposited by chemical vapor deposition (CVD). Alternatively, barrier layer 224 is deposited by a physical vapor deposition technique, such as sputtering.

Seed layer 227, in one embodiment, is formed from a conductive material deposited on barrier layer 224 to provide a site for depositing a metal to form an integrated circuit interconnect. In an alternate embodiment, seed layer 227 is formed from copper. In another an alternate embodiment, seed layer 227 is formed from an alloy of copper, such as CuAl. Seed layer 227 is deposited by physical vapor deposition or chemical vapor deposition to a depth that is sufficient to support an electroplating deposition process. In one embodiment, a seed layer of copper is deposited to a depth of between about 100 and 1000 angstroms. In still another alternate embodiment of an interconnect, seed layer 227 is not formed, and copper layer 230 is formed above barrier layer 224.

Copper layer 230, in one embodiment, is formed above the barrier layer 224 and the seed layer 227. In one embodiment, copper layer 230 is fabricated from copper or an alloy of copper, such as CuAl. Copper layer 230 is deposited above the barrier layer 224 and the seed layer 227 to a depth that overfills trenches 215 and 218, while under filling bond pad trench 221. In the preferred embodiment, copper layer 230 is deposited by electroplating. In an alternate embodiment, copper or copper alloy is deposited by CVD or sputtering. The depth of the copper deposited in trenches 215, 218, 221 is controlled by adjusting the deposition process. In one embodiment, trenches 215 and 218 are filled or overfilled, while trench 221 is under filled to permit latter filling with a material suitable for eutectically bonding to a gold wire using state-of-the-art wire-bonding processes.

FIG. 3 is a cross-sectional side view of substrate 200 having a barrier layer 300 deposited above copper layer 230 and a conductive layer 303 deposited above barrier layer 300. Barrier layer 300 is fabricated from a material that blocks the migration of copper into conductive layer 303. In one embodiment, barrier layer 300 is fabricated from a material, such as a refractory metal, TiN, TaN, Ti/TiN, Ta/TaN, or Ti/TaN. Conductive layer 303 is fabricated from a material that is easily and reliably wire-bonded using state of the art wire-bonding processes. In one embodiment, conductive layer 303 is fabricated from aluminum. In an alternate embodiment, conductive layer 303 is fabricated from an alloy of aluminum, such as AlCu. Conductive layer 303 is deposited on barrier layer 300 to a depth that is sufficient to wire-bond to a gold wire.

As shown in FIG. 3, the vertical barrier thickness 382 is the thickness of the barrier layer 224 at the bottom of a wide trench such as the bond pad trench 221. The vertical seed thickness 384 is the thickness of the seed layer 227 at the bottom of a wide trench such as the bond pad trench 221. The vertical copper thickness 386 is the thickness of the copper layer 230 at the bottom of a wide trench such as the bond pad trench 221. The vertical barrier thickness 388 is the thickness of the barrier layer 300 at the bottom of a wide trench such as the bond pad trench 221.

Critical depth 390, in one embodiment, is defined as follows: Critical depth 390=the vertical barrier thickness 382+vertical seed thickness 384+vertical copper thickness 386+vertical barrier thickness 388.

The trench depth 236 must be greater than the critical depth 390.

FIG. 4 is cross-sectional side view of substrate 200 of FIG. 3 after chemical mechanical polishing (CMP). CMP removes unwanted layers of metal from the surface of insulating layer 209. After CMP, the copper filling trenches 215 and 218 is flush with the surface of insulating layer 209. Also, after CMP, bonding pad trench 221 is partially filled by copper layer 230 and partially filled with conductive layer 303. Copper layer 230 and conductive layer 303 are flush with the surface of insulating layer 209 if the deposited thickness of conductive layer 303 is sufficient to finish filling the trench 221.

Figure 5:
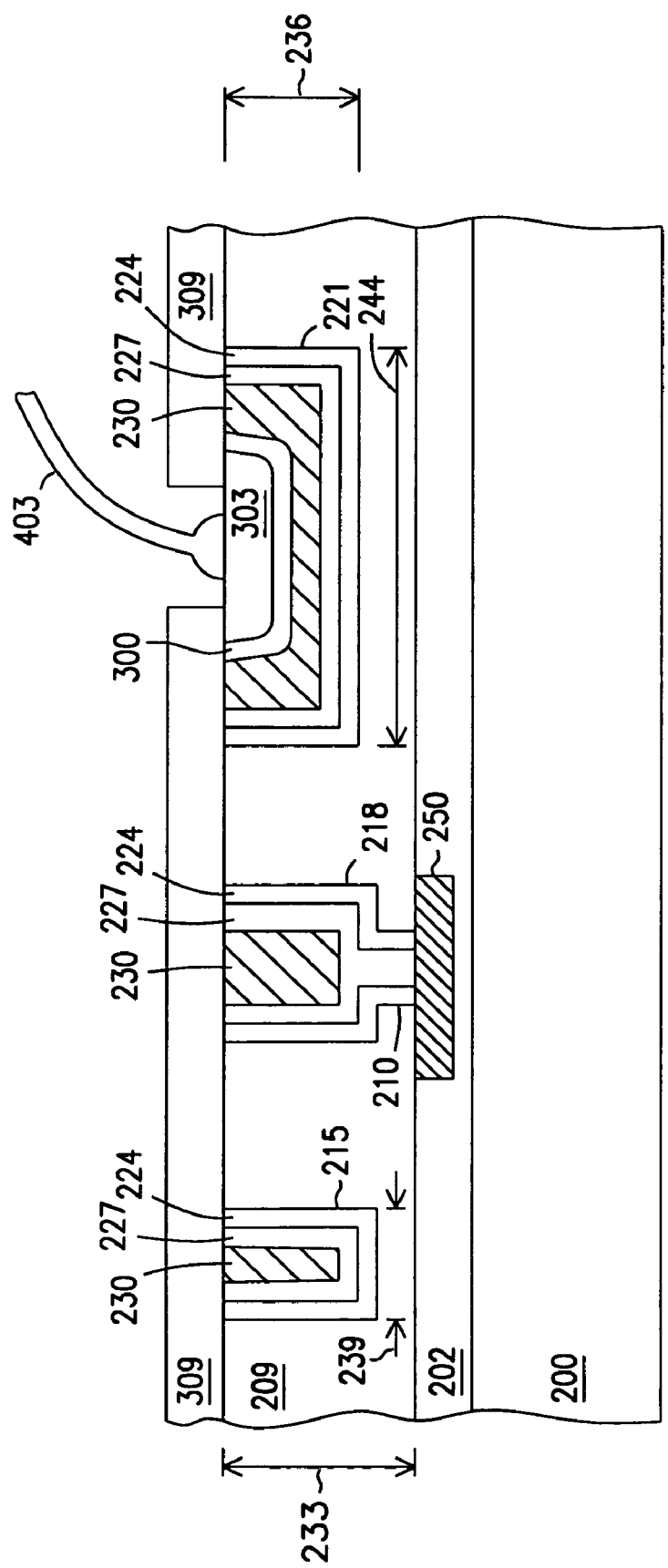
FIG. 5 is a cross-sectional side view of a substrate after opening holes in the passivation and wire bonding.

After chemical mechanical polishing of the metal stack layers 224, 227, 230, 300, 303, in one embodiment, a passivation layer 309 is deposited. This passivation layer may be oxide, nitride, oxide/nitride, nitride/oxide/nitride, polyimide, or any combination. The passivation layer is patterned and etched to create openings in the bond pad trench 221 exposing the conductive layer 303 as shown in FIG. 5. Wire bonds are then attached to conductive layer 303 through the openings in the passivation as shown in FIG. 5. In one embodiment, conductive layer 303 is a material that easily and reliably bonds with gold, such as aluminum or an aluminum copper alloy containing about one-half percent copper. Gold conductor 403 is wire-bonded to bonding material 400 to couple the bonding pad formed in trench 221 to an external connector.

In summary, given a metallization stack of n layers, each with bottom thickness $t_{b1}, t_{b2}, t_{b3}, \ldots, t_{bn}$ and each with sidewall thickness $t_{s1}, t_{s2}, t_{s3}, \ldots, t_{sn}$, so long as the trench depth is greater than the $$\text{critical depth} = \sum_{i=1}^{n-1} t_{bi}$$

then the number of layers in the metal stack in each trench will depend on the trench width. For example, for a metallization stack comprised of only metal layers and for trenches having a width $<2t_{s1}$, the trench will be completely filled with a first metal. For trenches having $2t_{s1}<\text{width}<2(t_{s1}+2t_{s2})$, the trench will contain a first metal layer and a second metal layer, but not any subsequently deposited metal layers. In this way, a plurality of trenches are easily formed with different metallizations programmed by defining the trench width.

An advantage of local multilayered metallization in bond pad trench 221 is that reliable wire-bonding using current state-of-the-art wire-bonding processes is enabled without adding masking steps to the integrated circuit manufacturing process.

Figure 6:
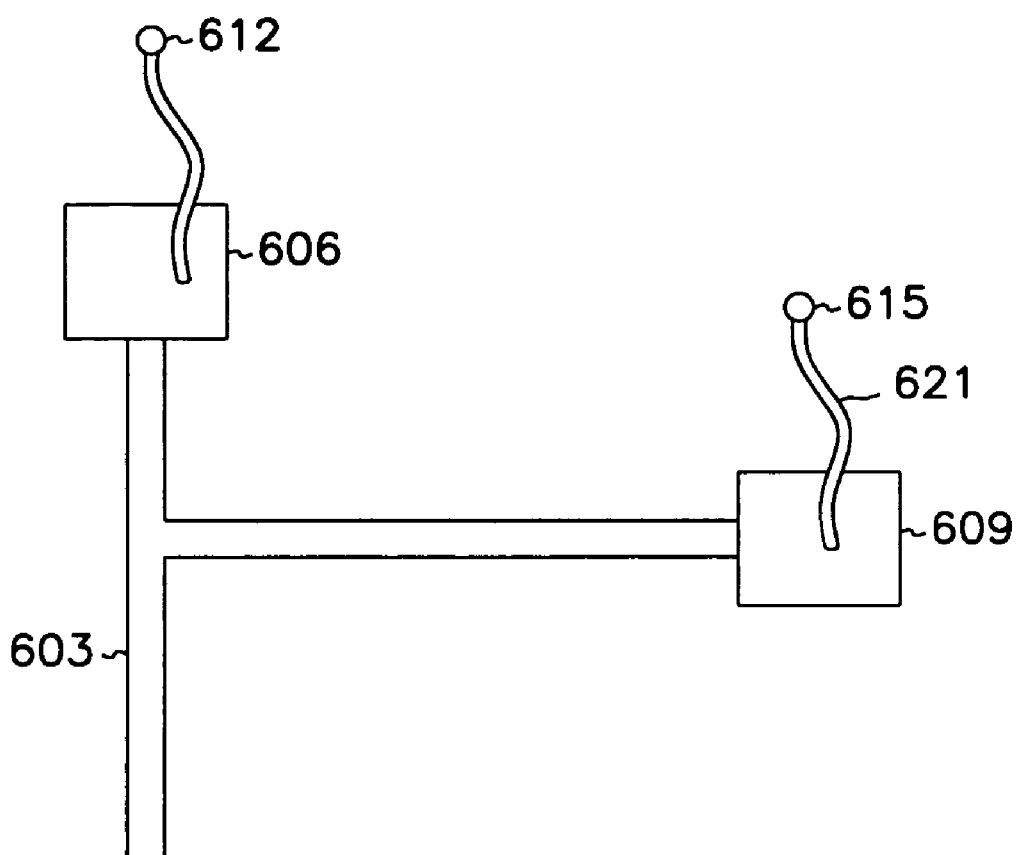
FIG. 6 is a top view of fine lines and wide lines coupled together.

FIG. 6 is a top view of fine line 603 coupled to wide lines 606 and 609. In one embodiment, fine line 603 is a signal carrying line and wide lines 606 and 609 are bonding pads for coupling signal carrying line 603 to off chip connectors 612 and 615. Off chip connector 612 is coupled to wide line 606 by conductive wire 618, and off chip connecter 615 is coupled to wide line 609 by conductive wire 621. Conductive wires 618 and 621 are fabricated from a conductor such as gold, and are coupled to wide lines 606 and 609 using wire-bonding techniques. In one embodiment, wide lines 606 and 609 have a surface layer of aluminum or an aluminum-copper alloy. The bond formed between the aluminum gold wire or between the aluminum-copper alloy and the gold wire is more reliable and stronger than a wire bond between gold and copper. The process for the fabrication of fine line 603 and wide lines 606 and 609 is described above.

Figure 7:
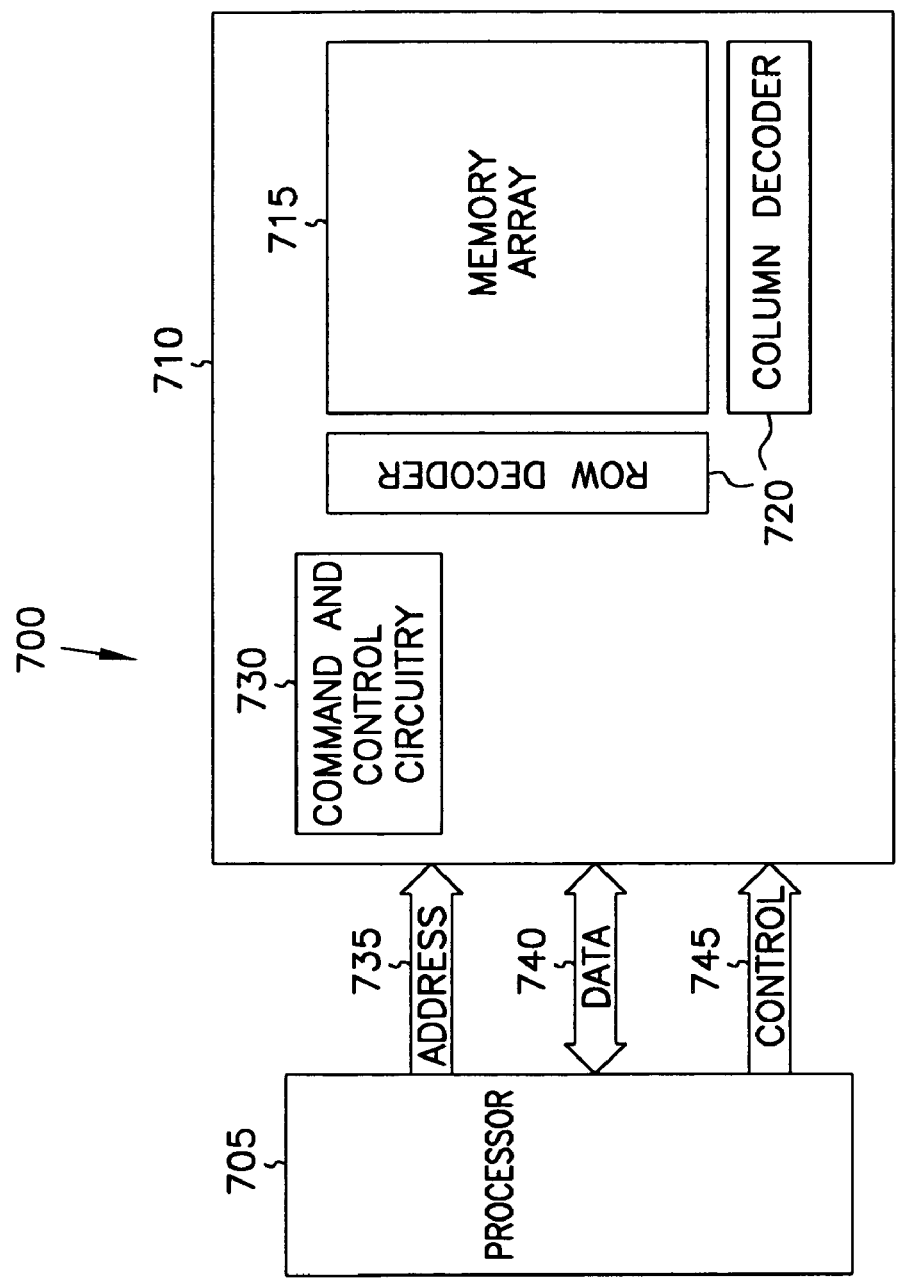
FIG. 7 a block diagram of a computer system suitable for use in connection with the present invention.

FIG. 7 a block diagram of a computer system 700 suitable for use in connection with the present invention. System 700 comprises processor 705 and memory device 710, which includes conductive structures and interconnects of one or more of the types described above in conjunction with FIGS. 1-6. The conductive structures and interconnects of the present invention are capable of coupling logic cells, logic devices, and integrated circuits commonly found in processor 705, such as a microprocessor, a reduced instruction set processor, or a parallel processor. The conductive structures and interconnects of the present invention are also capable of coupling memory devices, memory cells, and integrated circuit memories commonly found in memory device 710. Memory device 710 comprises memory array 715, address circuitry 720, and read circuitry 730, and is coupled to processor 705 by address bus 735, data bus 740, and control bus 745. Processor 705, through address bus 735, data bus 740, and control bus 745 communicates with memory device 710. In a read operation initiated by processor 705, address information, data information, and control information are provided to memory device 710 through busses 735, 740, and 745. This information is decoded by addressing circuitry 720, including a row decoder and a column decoder, and read circuitry 730. Successful completion of the read operation results in information from memory array 715 being communicated to processor 705 over data bus 740.

CONCLUSION

Several embodiments of a conductive structure and methods suitable for use with copper interconnects and state-of-the-art wire bonding systems have been described. These embodiments permit highly reliable wire-bonding connections between chip bond pads and package interconnects. Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. Therefore, it is intended that this invention be limited only by the claims and the equivalents thereof.

What is claimed is:

1. An interconnect comprising:
    an insulating layer having a top surface and a final thickness;
    a trench in the insulating layer, the trench having a width and a depth across the width of the trench, the depth being a substantially same depth across the width of the trench, the depth being less than the final thickness and greater than a critical depth across the width of the trench, wherein the critical depth includes a vertical thickness of a first barrier layer and a vertical thickness of a seed layer and a vertical thickness of a first metal layer and a vertical thickness of a second barrier layer;
    the trench including within the trench and below a level coplanar with the top surface at least and no more than the first barrier layer, the seed layer above the barrier layer, and the first metal layer above the seed layer when the width of the trench is less than a first critical width defined as twice the sum of a sidewall first barrier layer thickness, sidewall seed layer thickness, and a sidewall first metal layer thickness; and
    the trench including within the trench and below a level coplanar with the top surface at least the first barrier layer, the seed layer above the first barrier layer, the first metal layer above the seed layer, the second barrier layer above the first metal layer, and a second metal layer above the second barrier layer when the width of the trench is greater than a second critical width defined as twice the sum of the sidewall first barrier layer thickness, the sidewall seed layer thickness, the sidewall first metal layer thickness, and a sidewall second barrier layer thickness,
    wherein at least the first metal layer couples a first logic device to a second logic device.

2. The interconnect of claim 1, wherein the first metal layer is fabricated from copper.

3. The interconnect of claim 1, wherein each of the first metal layer and the second metal layer include a planar surface polished using chemical mechanical polishing.

4. The interconnect of claim 1, wherein the second metal layer includes aluminum.

5. The interconnect of claim 1, wherein the second metal layer is deposited on the second barrier layer to a depth sufficient to wire-bond the second metal layer to a gold wire.

6. An interconnect comprising:
    a first memory cell;
    a second memory cell coupled to the first memory cell through the interconnect;
    the interconnect having an insulating layer having a top surface and a final thickness and a trench in the insulating layer, the trench having a width and a depth across the width of the trench, the depth being a substantially same depth across the width of the trench, the depth being less than the final thickness and greater than a critical depth across the width of the trench, wherein the critical depth includes a vertical thickness of a first barrier layer and a vertical thickness of a seed layer and a vertical thickness of a first metal layer and a vertical thickness of a second barrier layer;
    the trench including within the trench and below a level coplanar with the top surface at least and no more than the first barrier layer, the seed layer above the barrier layer, and the first metal layer above the seed layer when the width of the trench is less than a first critical width defined as twice the sum of a sidewall first barrier layer thickness, sidewall seed layer thickness, and a sidewall first metal layer thickness; and
    the trench including within the trench and below a level coplanar with the top surface at least the first barrier layer, the seed layer above the first barrier layer, the first metal layer above the seed layer, the second barrier layer above the first metal layer, and a second metal layer above the second barrier layer when the width of the trench is greater than a second critical width defined as twice the sum of the sidewall first barrier layer thickness, the sidewall seed layer thickness, the sidewall first metal layer thickness, and a sidewall second barrier layer thickness.

7. An interconnect comprising:
    an insulating layer having a top surface and a final thickness and including a first trench and a second trench;
    the first trench including a first barrier layer and a seed layer therein, the first trench having a depth greater than a critical depth and a width less than twice a first sidewall thickness;
    the second trench including the first barrier layer and the seed layer therein, the second trench having the depth of the first trench and a width greater than twice the first sidewall thickness and less than twice a sum of the first sidewall thickness and a second sidewall thickness;
    a first metal layer above the first trench and the second trench; and
    a second metal layer above the second trench;
    wherein the critical depth includes a vertical thickness of the first barrier layer and a vertical thickness of the seed layer and a vertical thickness of a metal layer and a vertical thickness of a second barrier layer.

8. The interconnect of claim 7, wherein the first metal layer above the first trench couples a first integrated circuit device to a second integrated circuit device in a memory module.

9. The interconnect of claim 7, wherein the first metal layer above the first trench couples a first integrated circuit device to a second integrated circuit device in a logic module.

10. An interconnect comprising:
    an insulating layer having a top surface and a final thickness and including a first trench and a second trench;
    the first trench including a first barrier layer and a seed layer therein, the first trench having a top and a depth greater than a critical depth, and a width less than a sidewall width of a first metal;
    the second trench including the first barrier layer and the seed layer therein, the second trench having a depth greater than the critical depth, and a width greater than twice the sidewall width of the first barrier layer and the seed layer and the first metal, and less than twice a sidewall width of a second metal; and a first and a second metal deposited on the first trench and the second trench, the second metal is planarized to the top of the first trench.

11. The interconnect of claim 10, wherein the second metal comprises Al.

12. The interconnect of claim 10, wherein the second metal is planarized by chemical mechanical polishing.

13. An interconnect comprising:

a first trench including a first barrier layer and a seed layer and a metal layer therein, the first trench having a width; and a second trench having a depth greater than a critical depth and a second width greater than the width, the second trench having a plurality of metal layers and at least one of the plurality of metal layers is coupled to the metal layer;

wherein the critical depth includes a vertical thickness of the first barrier layer and a vertical thickness of the seed layer and a vertical thickness of a first metal layer of the plurality of metal layers and a vertical thickness of a second barrier layer.

14. The interconnect of claim 13, further comprising a wire bond coupling a conductive material to at least one of the plurality of metal layers.

15. The interconnect of claim 14, wherein at least one of the plurality of metal layers is aluminum.

16. An interconnect comprising:

a first trench including a first barrier layer and a seed layer and a copper layer therein, the first trench having a depth greater than a critical depth; and a second trench wider than the trench, and the second trench including the first barrier layer and the seed layer and the copper layer and having a plurality of metal layers therein, wherein at least one of the plurality of layers is an aluminum layer, and at least one of the plurality of metal layers is coupled to the copper layer;

wherein the critical depth includes a vertical thickness of the first barrier layer and a vertical thickness of the seed layer and a vertical thickness of a metal layer and a vertical thickness of a second barrier layer.

17. The interconnect of claim 16, wherein the aluminum layer is an aluminum alloy layer.

18. The interconnect of claim 16, wherein at least one of the plurality of metal layers is a copper alloy layer.

19. The interconnect of claim 16, wherein the aluminum layer is wire-bonded to a conductive material.

20. The interconnect of claim 19, wherein the conductive material is gold.

21. An interconnect comprising:

a first trench including a first barrier layer and a seed layer therein, the first trench having a depth less than a critical depth and a width less than a critical width and a metal layer; and a second trench having a depth greater than the critical depth;

a plurality of metal layers above the second trench, at least one of the plurality of metal layers is coupled to the metal layer, wherein at least one of the plurality of metal layers is capable of forming a highly reliable eutectic bond to a conductive material;

wherein the critical depth includes a vertical thickness of the first barrier layer and a vertical thickness of the seed layer and a vertical thickness of a metal layer and a vertical thickness of a second barrier layer, and wherein the critical width includes twice the sum of the first barrier layer sidewall thickness and the seed layer sidewall thickness and the metal layer sidewall thickness.

22. The interconnect of claim 21, wherein the metal layer is copper.

23. The interconnect of claim 22, wherein at least one of the plurality of metal layers is aluminum.

24. The interconnect of claim 21, wherein at least one of the plurality of metal layers is an aluminum alloy.

25. An interconnect comprising:

a first trench including a first barrier layer, a seed layer, and a first metal layer therein, the first trench having a depth greater than a critical depth;

a second trench including the first barrier layer, the seed layer and a plurality of metal layers therein, at least one of the plurality of metal layers is coupled to the first metal layer, wherein only one of the plurality of metal layers is capable of forming a highly reliable eutectic bond to a gold wire; and wherein the critical depth includes a vertical thickness of the first barrier layer and a vertical thickness of the seed layer and a vertical thickness of the first metal layer and a vertical thickness of a second barrier layer.

26. The interconnect of claim 25, wherein the second trench has a depth greater than the critical depth.

27. A conductive structure comprising:

a first trench including a first barrier layer, a seed layer, and a first metal layer therein, the first trench having a width, and a depth greater than a critical depth in every part of the first trench; and a second trench including the first barrier layer and the seed layer therein and the second trench having a width, a depth greater than the critical depth in every part of the second trench, and a plurality of metal layers therein, the width of the second trench is greater than the width of the first trench, and at least one of the plurality of the metal layers is electrically coupled to the first metal layer;

wherein the critical depth includes a vertical thickness of the first barrier layer and a vertical thickness of the seed layer and a vertical thickness of the first metal layer and a vertical thickness of a second barrier layer.

28. A conductive structure comprising:

a narrow trench including a first barrier layer, a seed layer and a first metal layer therein, the narrow trench having a first depth greater than a critical depth; and a wide trench having a plurality of metal layers therein and a second depth equal to the first depth, wherein at least one of the plurality of metal layers is coupled to the first metal layer;

wherein the critical depth includes a vertical thickness of the first barrier layer and a vertical thickness of the seed layer and a vertical thickness of the first metal layer and a vertical thickness of a second barrier layer.

29. An interconnect comprising:

a trench including a first barrier layer; a seed layer, and a metal layer therein, the trench having a width less than a critical width, a first depth greater than a critical depth in every part of the trench; and a wide depression having a second width greater than the critical width, a second depth equal to the first depth, and a plurality of metal layers, wherein at least one of the plurality of metal layers is coupled to the metal layer;

wherein the critical width includes twice the sum of the first barrier layer sidewall thickness and the seed layer sidewall thickness and the metal layer sidewall thickness;

wherein the critical depth includes a vertical thickness of the first barrier layer and a vertical thickness of the seed layer and a vertical thickness of the metal layer and a vertical thickness of a second barrier layer.

30. An interconnect comprising:

an insulating layer having a top surface and a final thickness;

a trench in the insulating layer, the trench having a width and a depth across the width of the trench, the depth being a substantially same depth across the width of the trench, the depth being less than the final thickness and greater than a critical depth across the width of the trench, wherein the critical depth includes a vertical thickness of a first barrier layer and a vertical thickness of a seed layer and a vertical thickness of a first metal layer and a vertical thickness of a second barrier layer;

the trench including within the trench and below a level coplanar with the top surface at least and no more than the first barrier layer, the seed layer above the barrier layer, and the first metal layer above the seed layer when the width of the trench is less than a first critical width defined as twice the sum of a sidewall first barrier layer thickness, sidewall seed layer thickness, and a sidewall first metal layer thickness;

the trench including within the trench and below a level coplanar with the top surface at least the first barrier layer, the seed layer above the first barrier layer, the first metal layer above the seed layer, the second barrier layer above the first metal layer, and a second metal layer above the second barrier layer when the width of the trench is greater than a second critical width defined as twice the sum of the sidewall first barrier layer thickness, the sidewall seed layer thickness, the sidewall first metal layer thickness, and a sidewall second barrier layer thickness, and a passivation layer above the top surface of the insulating layer and above at least a portion of the trench, the passivation layer including an opening exposing the second metal layer.

31. The interconnect of claim 30, including a wire bond attached to the second metal layer through the opening in the passivation layer.

32. The interconnect of claim 31, wherein the wire bond includes a gold conductor.

* * * * *